United States Patent
Lin et al.

(10) Patent No.: US 11,257,997 B2
(45) Date of Patent: Feb. 22, 2022

(54) SEMICONDUCTOR STRUCTURE

(71) Applicant: TAIWAN SEMICONDUCTOR MANUFACTURING COMPANY LTD., Hsinchu (TW)

(72) Inventors: Chia-Hua Lin, Hsinchu (TW); Yao-Wen Chang, Taipei (TW); Chii-Ming Wu, Hsinchu County (TW); Cheng-Yuan Tsai, Hsin-Chu County (TW); Eugene I-Chun Chen, Taipei (TW); Tzu-Chung Tsai, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 116 days.

(21) Appl. No.: 16/732,222

(22) Filed: Dec. 31, 2019

(65) Prior Publication Data

US 2021/0202809 A1 Jul. 1, 2021

(51) Int. Cl.
*H01L 33/60* (2010.01)
*H01L 27/15* (2006.01)
*H01L 33/62* (2010.01)

(52) U.S. Cl.
CPC .......... *H01L 33/60* (2013.01); *H01L 27/156* (2013.01); *H01L 33/62* (2013.01)

(58) Field of Classification Search
None
See application file for complete search history.

(56) References Cited

U.S. PATENT DOCUMENTS

| 2011/0057279 A1* | 3/2011 | Lee ................... H01L 27/14609 257/432 |
| 2011/0108705 A1* | 5/2011 | Izuha ................ H01L 27/14687 250/208.1 |
| 2015/0083464 A1* | 3/2015 | Zilbauer .............. H05K 3/0091 174/251 |

FOREIGN PATENT DOCUMENTS

| CN | 102024832 A | 4/2011 |
| TW | 201334225 A1 | 8/2013 |
| WO | WO2019054943 A1 | 9/2013 |

OTHER PUBLICATIONS

Non-Final Office Action, Search Report dated Feb. 20, 2021 issued by the Taiwan Intellectual Property Office for Taiwan Counterpart Application No. 109126571.
English Abstract of CN102024832A.
(Continued)

*Primary Examiner* — Robert K Carpenter
(74) *Attorney, Agent, or Firm* — WPAT, P.C., Intellectual Property Attorneys; Anthony King

(57) ABSTRACT

A semiconductor structure is provided. The semiconductor structure includes metallization structure, a plurality of conductive pads, and a dielectric layer. The plurality of conductive pads is over the metallization structure. The dielectric layer is on the metallization structure and covers the conductive pad. The dielectric layer includes a first dielectric film, a second dielectric film, and a third dielectric film. The first dielectric film is on the conductive pad. The second dielectric film is on the first dielectric film. The third dielectric film is on the second dielectric film. The a refractive index of the first dielectric film is smaller than a refractive index of the second dielectric film, and the refractive index of the second dielectric film is smaller than a refractive index of the third dielectric film.

20 Claims, 19 Drawing Sheets

(56) References Cited

OTHER PUBLICATIONS

Brief English Translation of Non-Final Office Action and Search Report dated Feb. 20, 2021 issued by the Taiwan Intellectual Property Office for Taiwan Counterpart Application No. 109126571.

* cited by examiner

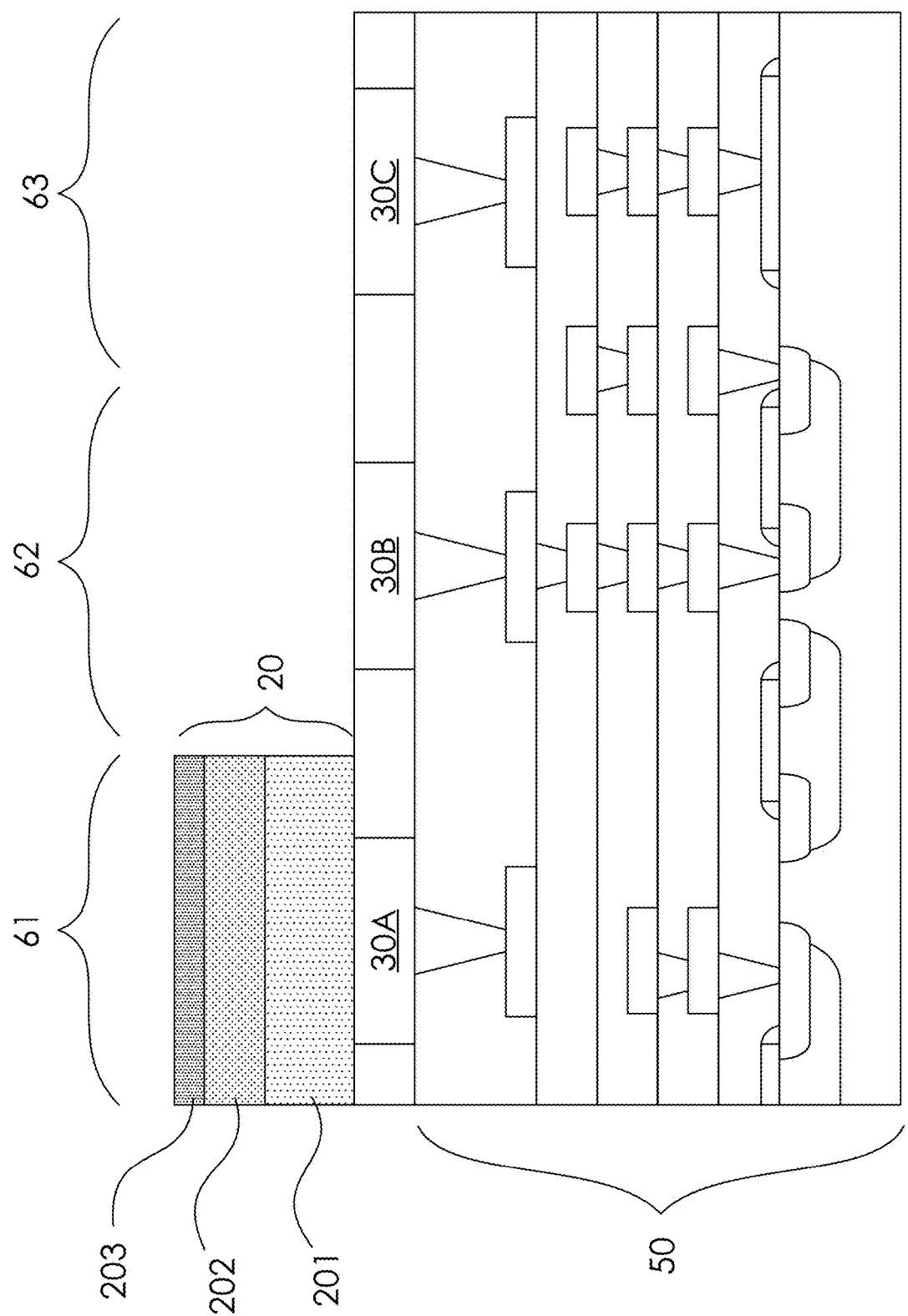

SEMICONDUCTOR STRUCTURE

FIELD

The present disclosure is related to a semiconductor structure and, more particularly, to a semiconductor structure having a reflective structure with ascending refractive index.

BACKGROUND

Light-emitting diodes (LED) are considered playing an important role among the display technologies for the next-generation. The chip for LED display bears similar features to those currently in use for general lighting, but its size is shrunk to below 200 microns. In theory, micro-LED displays may make LED structures thinner, smaller, and in an array structure. The size of individual micro-LED usually ranges from 1 to 10 µm. In general, the advantages of high efficiency and long life span of conventional LED chips are inherited by miniaturized ones, and as the size gets smaller, the resolution may be enhanced.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
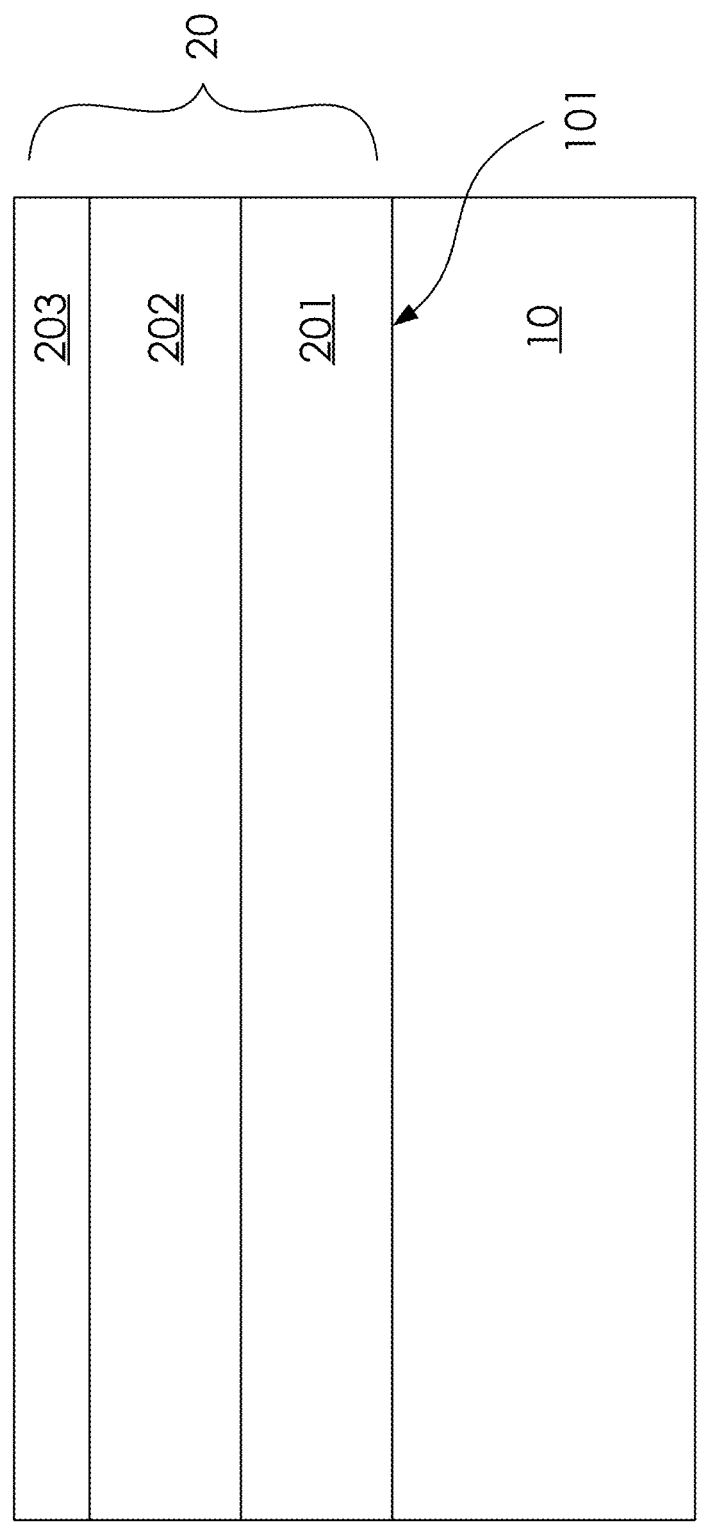
FIG. 1 illustrates a cross-sectional view of a reflective structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

The reflectivity is the ratio of reflected optical power to the incident optical power at a flat surface of an object. It can be influenced by several physical properties of the reflecting object such as the type of surface materials, surface roughness, thickness, uniformity, flatness, geometric structure of the object, etc. For example, the higher of the uniformity of the surface material, the higher of reflectivity may be presented.

As shown in FIG. 1, in some embodiments, the reflective structure 1 of the present disclosure includes a metal base 10 and a dielectric layer 20. The metal base 10 has a first surface 101. The dielectric layer 20 includes a first dielectric film 201, a second dielectric film 202, and a third dielectric film 203.

The metal base 10 may be a conductive pad and may be made by any suitable conductive material includes but not limited to metal (e.g., copper, tantalum, titanium, molybdenum, tungsten, platinum, aluminum, hafnium, ruthenium), alloy, metal silicide (e.g., titanium silicide, cobalt silicide, nickel silicide, tantalum silicide), or metal nitride (e.g., titanium nitride, tantalum nitride). In some embodiments, the metal base is made by aluminum copper. In some embodiments, the metal base 10 is formed by chemical vapor deposition (CVD), low pressure chemical vapor deposition, physical vapor deposition (PVD), atomic layer deposition, or spin-on.

The dielectric layer 20 is disposed on the first surface 101 of the metal base 10, and accordingly, the first dielectric film 201, the second dielectric film 202, and the third dielectric film 203 are stacked over the metal base 10. The dielectric layer 20 on the metal base 10 is configured to reflect lights with the metal base 10. More precisely, an incident ray shined on the metal base 10 may firstly travel through the third dielectric film 203, the second dielectric film 202, and the first dielectric film 201 sequentially before being reflected by the first surface 101 of the metal base 10, and the reflected ray may then travel back reversely.

Because the dielectric layer 20 is not composed of a single film, the incident ray and reflected ray traveled therein may be influenced under Snell's Law. That is, while the ray travels from one medium to another, for instance, from the third dielectric film 203 to the second dielectric film 202, the ray may be refracted if the refractive indexes thereof are different. According to Snell's Law, when n1 and n2 represent the refractive indexes for the two media, and θ1 and θ2 are the angles of incidence and refraction that the ray makes with the perpendicular line at the boundary. Snell's law asserts that $n1/n2 = \sin\theta1/\sin\theta2$.

In some embodiments, a refractive index of the first dielectric film 201 is smaller than a refractive index of the second dielectric film 202, and the refractive index of the second dielectric film 202 is smaller than a refractive index of the third dielectric film 203. In other words, the refractive index of a dielectric film proximity to the metal base 10 are smaller than the refractive indexes of a dielectric film distance to the metal base 10. In some embodiments, the refractive indexes of the dielectric films from the bottom of the dielectric layer 20 to the top of the dielectric layer 20 are changed in an ascending order.

In the present disclosure, the refractive indexes ascending from the bottom of the dielectric layer to the top of the dielectric layer may increase the total reflectivity of light of the reflective structure. In some embodiments, the refractive indexes of the dielectric films of the dielectric layer 20 are in a range about 1.47 to about 1.8. In some embodiments, the refractive indexes of the first dielectric film 201 and the third dielectric film 203 are 1.47 and 1.8, respectively, while the refractive index of the second dielectric film 202 is at some point between 1.47 and 1.8, which is different to the first dielectric film 201 and the third dielectric film 203.

Figure 2:
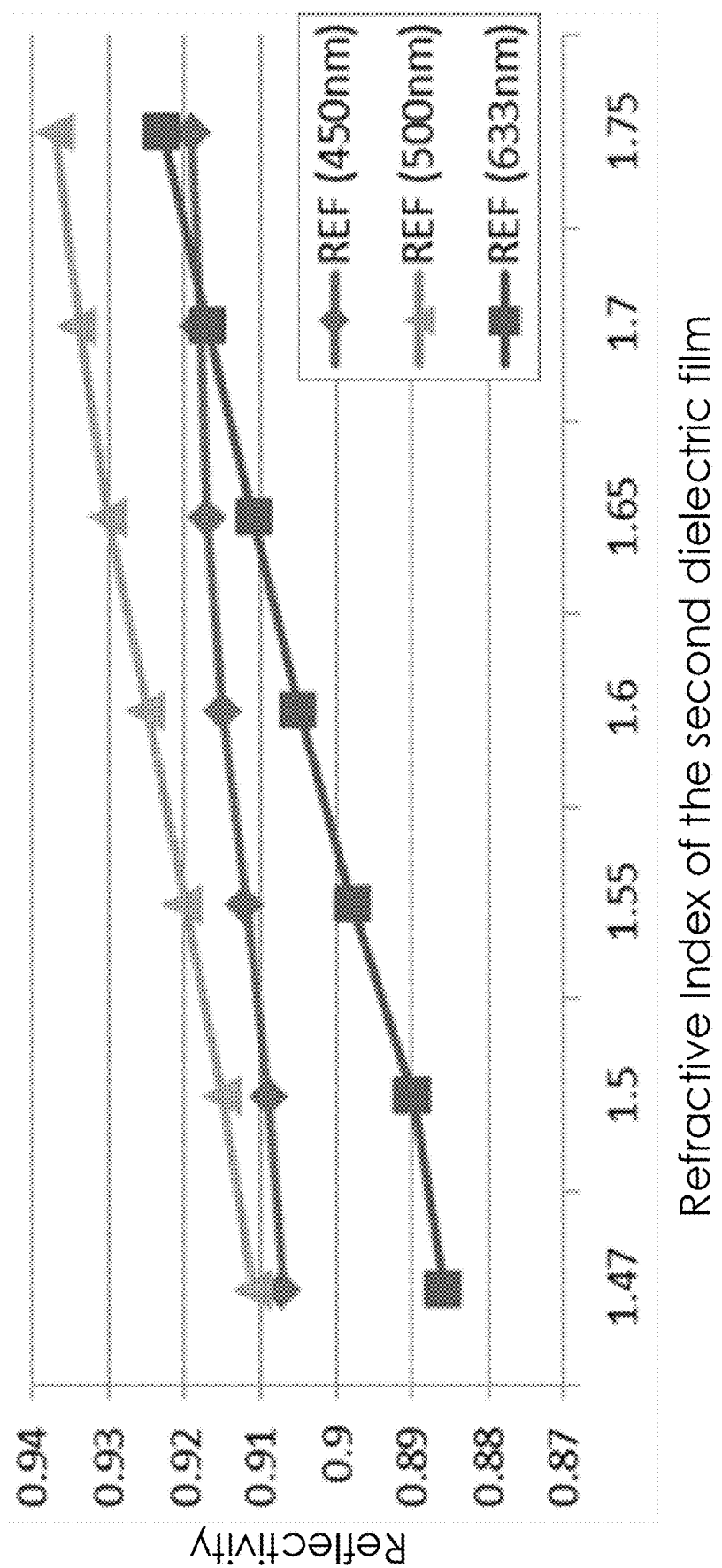
FIG. 2 illustrates a line chart regarding the reflectivity and the refractive index of the second dielectric film according to some embodiments of the present disclosure.

Referring to FIG. 2, FIG. 2 illustrates a relation between total reflectivity (Y axis) of the dielectric layer 20 with respect to the change of the refractive index (X axis) of the second dielectric film 202 of the dielectric layer 20. The total reflectivity of light shows a trend of increase when the refractive index of the second dielectric film 202 is increased. Comparing between the reflectivity of the red light (with wavelength at about 633 nm, labeled as square dots) in the examples R1 and R2, when the refractive indexes of the first dielectric film 201 and the second dielectric film 202 are identical, as demonstrated in the example R1, a total reflectivity of about 88.6% is lower than a total reflectivity of about 91.7% of R2, in which the refractive index of the first dielectric film 201 is lower than that of the second dielectric film 202. Alternatively, by changing the refractive index of the second dielectric film 202 from identical to greater than that of the first dielectric film 201, the reflectivity of the red light in the dielectric layer 20 may be increased from 88.6% to 91.7%, with refractive index of the third dielectric film 203 unchanged.

Moreover, as shown in FIG. 2, not only the red light, but also the total reflectivity of the green light (with wavelength at about 500 nm, labeled as triangle dots) and the total reflectivity of the blue light (with wavelength at about 450 nm, labeled as diamond dots) are all increased as the increasing of the refractive index of the second dielectric film 202. In other words, in the wavelength range of visible light, the total reflectivity may be increased if the refractive index of the second dielectric film 202, or the middle layer of the dielectric film 202, is between the refractive index range of the first dielectric film 201 and the third dielectric film 203.

Also, according to FIG. 2, the total reflectivity of light shows a positive correlation with the refractive index of the second dielectric film 202. For example, in the case of the refractive indexes of the first dielectric film 201 and the third dielectric film 203 are 1.47 and 1.8, respectively, the increase of the total reflectivity of light is more prominent when the refractive index of the second dielectric film 202 is increased from 1.47 to 1.75, as opposed to being increased from 1.47 to 1.5. In some embodiments, the total reflectivity of light may be further increased if the refractive index of the second dielectric film 202 is higher than an average of the refractive indexes of the first dielectric film 201 and the third dielectric film 203. That is, when the refractive index of the first dielectric film 201 is about 1.47, and the refractive index of the third dielectric film 203 is about 1.8, the total reflectivity of light may be further increased if the refractive index of the second dielectric film 202 is greater than 1.63.

By increasing the total reflectivity of the light through arranging the order of the dielectric films, the requirement regarding the uniformity of the dielectric layer 20 may be alleviated. More precisely, in order to reach high reflectivity, the formation of the dielectric layer on a reflective metal is required to have a rigorous planarization process to meet a surface roughness uniformity of <1% (3 sigma). However, such requirement regarding the uniformity may be alleviated because the ascending order of the refractive indexes of the dielectric films may provide, for instance, an increase of total reflectivity more than 3% as shown in FIG. 2. Accordingly, it would be more flexible in manufacturing reflectors in semiconductor structures.

Figure 3:
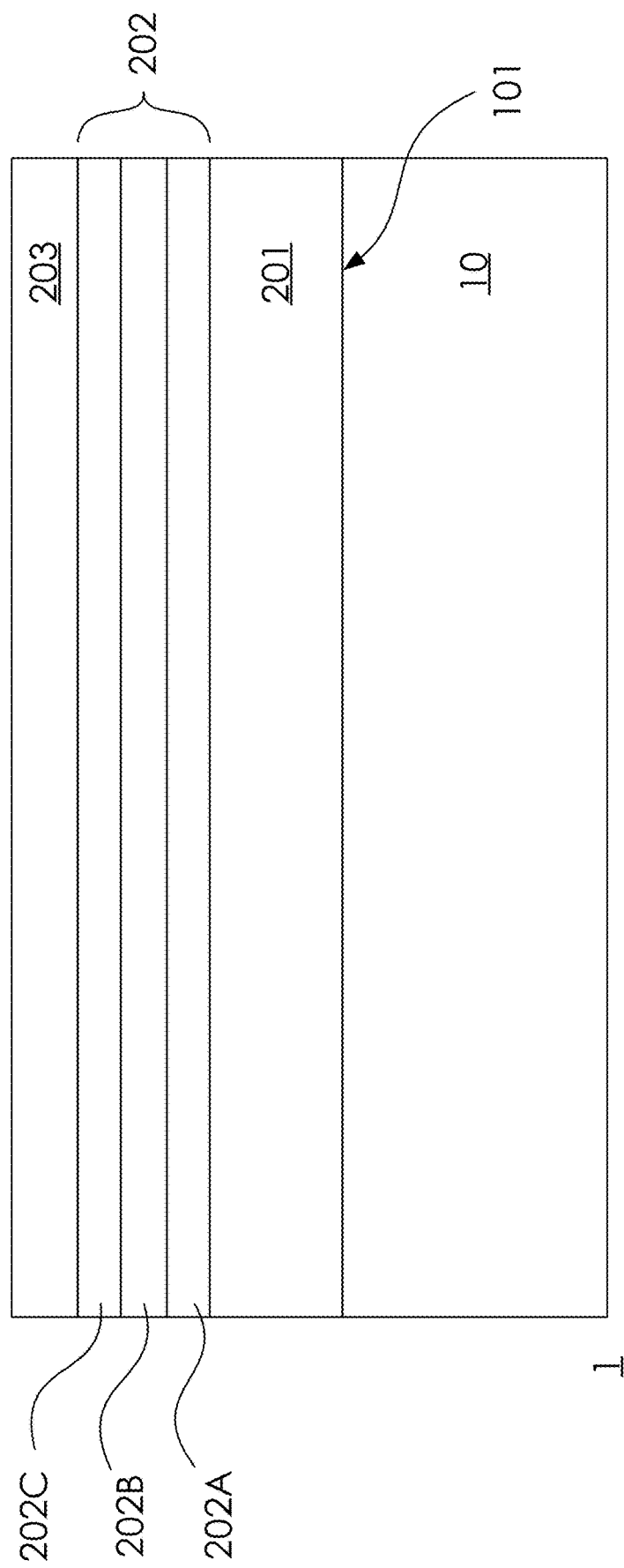
FIG. 3 illustrates a cross-sectional view of a reflective structure according to some embodiments of the present disclosure.

Referring to FIG. 3, in some embodiments, the dielectric layer 20 may include more than three dielectric films. In some embodiments, the second dielectric film 202 may include a plurality of sublayers, for example, the sublayers 202A, 202B, and 202C as shown in FIG. 3. In some embodiments, the sublayers 202A, 202B, and 202C are disposed between the first dielectric film 201 and the third dielectric film 203. In such embodiments, the refractive indexes of the sublayers 202A, 202B, and 202C are arranged in an order that the sublayers closer to the third dielectric film 203 has higher refractive indexes, that is, the refractive index of a bottom sublayer of the second dielectric film 202 (e.g. sublayer 202A) is smaller than the refractive index of a top sublayer of the second dielectric film 202 (e.g. sublayer 202C).

Figure 4:
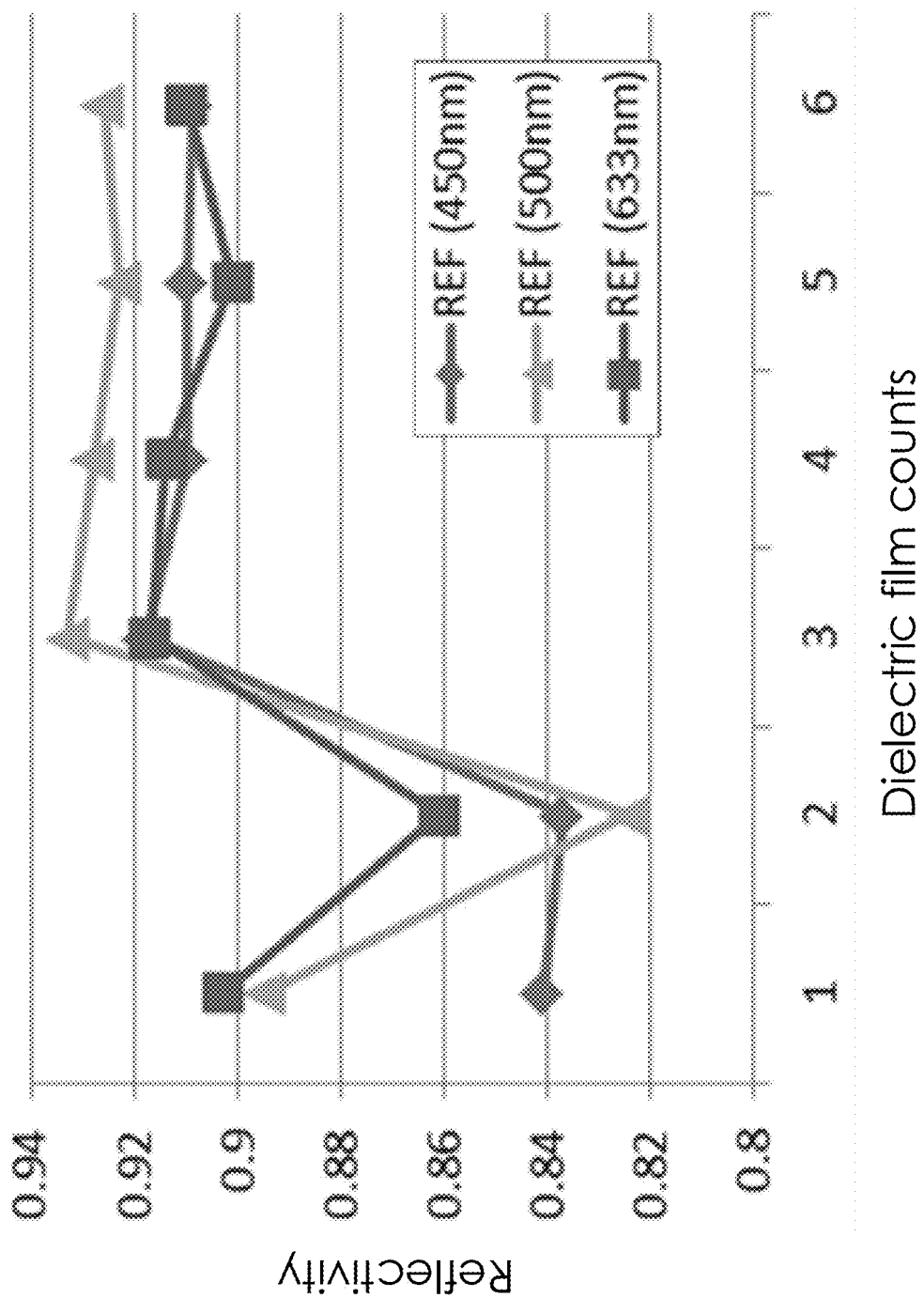
FIG. 4 illustrates a line chart regarding the total reflectivity and the dielectric film counts according to some embodiments of the present disclosure.

The counts of the sublayers of the second dielectric film 202 are not limited to the sublayers as shown in FIG. 3. Referring to FIG. 4, FIG. 4 shows a relation of the total reflectivity with respect to the dielectric film counts. When the second dielectric film 202 includes four sublayers, as previously discussed in FIG. 3, in addition to the first dielectric film 201 and the third dielectric film 203, the dielectric layer 20 possess a film counts of six dielectric films. The total reflectivity of light is still higher than that of a reflector with only one or two dielectric films. In other words, in the case of the dielectric layer 20 having a dielectric film counts of three, total reflectivity substantially saturates its performance even if the film counts go up. Considering FIG. 2 and FIG. 4, with an ascending refractive index from the first dielectric film 201 to the third dielectric film 203, or a middle film thereof further includes a multi-sublayer structure with an ascending refractive index, the total reflectivity of light may be increased in such dielectric film arrangement. In some embodiments, the refractive indexes of the plurality of sublayers are in a range of from about 1.47 to about 1.8.

In some embodiments, the material of the first dielectric film 201 is identical with the material of the second dielectric film 202. In some embodiments, the material of the first dielectric film 201 is silicon oxide. In some embodiments, although the materials of the first dielectric film 201 and the second dielectric film 202 are identical, the refractive indexes of the first dielectric film 201 and the second dielectric film 202 are still different by selecting different precursors or adjusting the ratio of the precursor during the forming operation of the dielectric films.

In some embodiments, the material of the first dielectric film 201 is different from the material of the third dielectric film 203. In some embodiments, the material of the third dielectric film 203 is aluminum oxide.

In some embodiments, each of the materials of the first dielectric film 201, the second dielectric film 202, and the third dielectric film 203 has an extinction coefficient (k) substantially equal to zero so that the light passing through may not be substantially attenuated.

Figure 5:
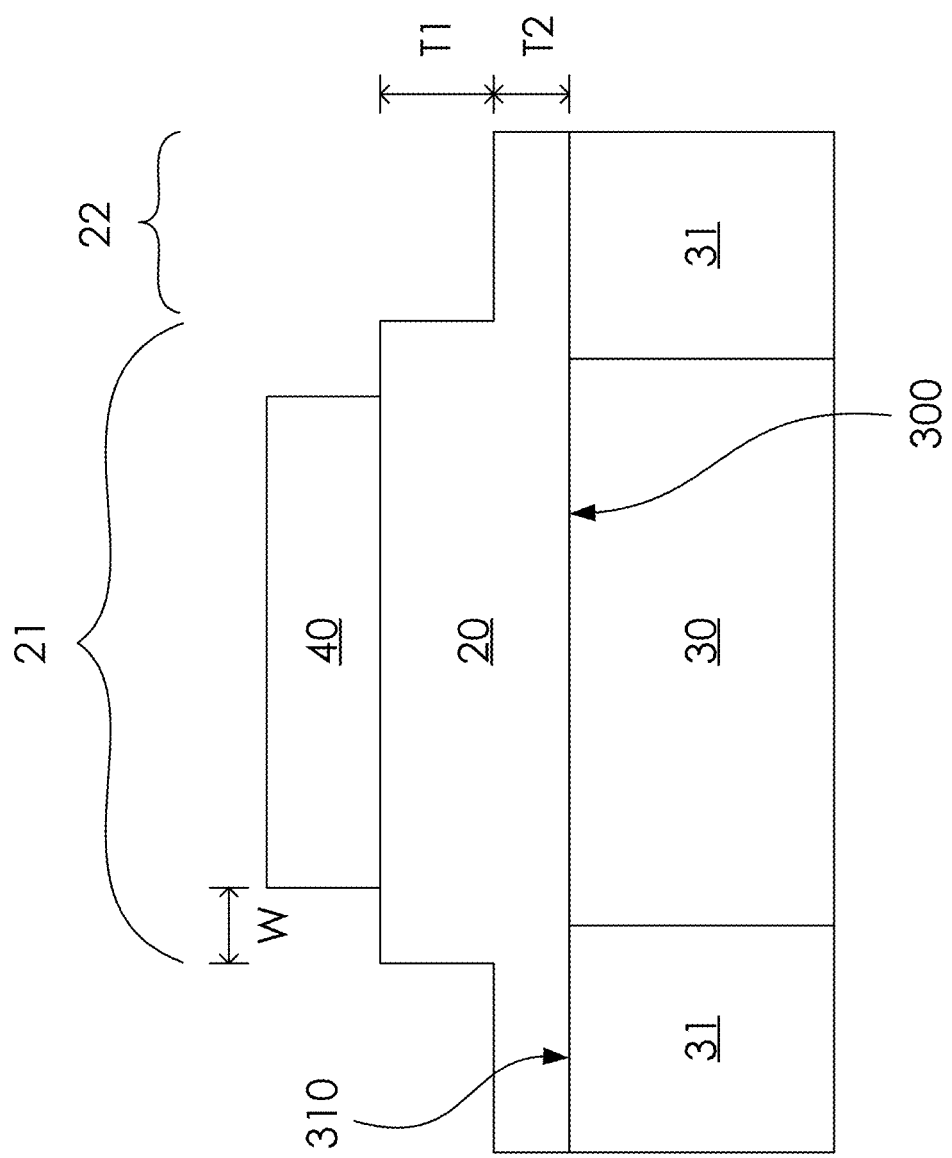
FIG. 5 illustrates a cross-sectional view of a reflective structure according to some embodiments of the present disclosure.

Referring to FIG. 5, in some embodiments, a conductive oxide layer 40 is disposed over the dielectric layer 20, and a conductive pad 30 is disposed below the dielectric layer 20. The material and the forming method of the conductive pad 30 may refer to the previously described metal base in FIG. 1. In some embodiments, the conductive pad 30 is laterally surrounded by an insulating layer 31. In some embodiments, a top surface 310 of the insulating layer 31 is coplanar with a top surface 300 of the conductive pad 30.

Moreover, in some embodiments, the dielectric layer 20 includes a raised portion 21 and at least an edge portion 22 at a side of the dielectric layer 20. As shown in FIG. 5, the thickness of the dielectric layer 20 is varied in different portions.

The thickness of the dielectric layer 20, particularly, the thickness T1 of the raised portion 21 is associated with the color of the reflected ray reflected by the present disclosure. More precisely, the color of the reflected ray is determined by the thickness of the dielectric layer 20, because portions of the wavelength of the incident ray shined on the top surface 300 of the conductive pad 30 may be absorbed depends on the thickness of the dielectric layer 20 and only other portions of the wavelength of the incident ray may be reflected. In some embodiments, the light with a wavelength at about 630 nm to about 750 nm may be reflected by the reflective structure with a thickness of the dielectric layer 20 at about 1500 angstroms and thereby be observed as red light. In some embodiments, the light with a wavelength at about 490 nm to about 570 nm may be reflected by the reflective structure with a thickness of the dielectric layer 20 at about 700 angstroms and thereby be observed as green light. In some embodiments, the light with a wavelength at about 450 nm to about 490 nm may be reflected by the reflective structure with a thickness of the dielectric layer 20 at about 50 angstroms and thereby be observed as blue light. In other words, with the decreasing of the thickness of dielectric layer 20, the wavelength of the reflected ray is also decreased and beyond the range of visible light eventually.

Furthermore, the thickness T2 of the edge portion 22 is smaller than the thickness T1 of the raised portion 21, whereas in some embodiments, the edge portion 22 is the area that not for reflecting visible light. Therefore, in some embodiments, the thickness T2 of the edge portion 22 is smaller than about 50 angstroms and no visible light may be substantially reflected at the edge portion 22.

Still referring to FIG. 5, in some embodiments, the conductive pad 30 is entirely covered by the raised portion 21. In some embodiments, not only the conductive pad 30, but also a portion of the insulating layer 31 is covered by the raised portion 21. For instance, according to the sectional view in FIG. 5, the raised portion 21 may be wider than the conductive pad 30 with a width W at each side of the raised portion 21. Therefore, some oblique incident rays may also travel through the raised portion 21 and be reflected. In some embodiments, the area of the raised portion 21 is greater than the area of the conductive pad 30 there below. In some embodiment, FIG. 5 shows a portion of a pixel in a light emitting device adjacent to its light-receiving side.

Figure 6A:
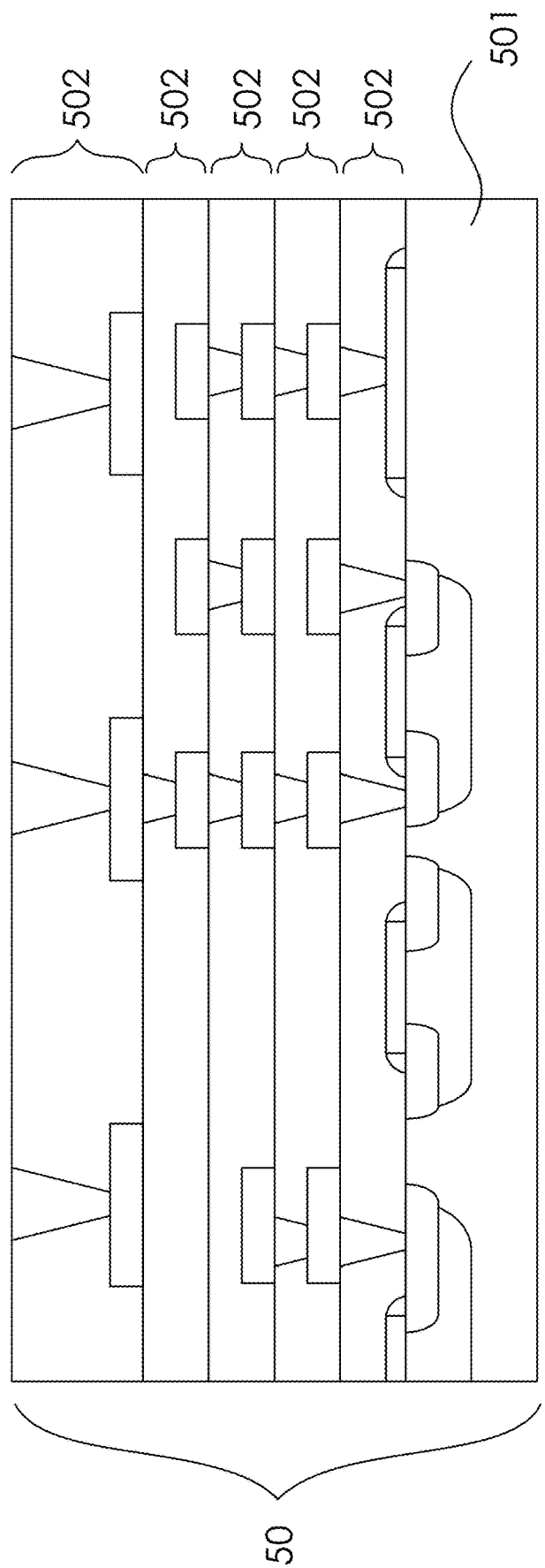
FIGS. 6A, 6B, 6C, 6D, 6E, 6Ea, 6F, 6Fa, 6G, 6H and 6I illustrate cross-sectional views at various operations of manufacturing a semiconductor structure according to some embodiments of the present disclosure.

Referring to FIGS. 6A to 6H, in manufacturing a semiconductor structure with a reflective structure, in some embodiments, a metallization structure 50 may be firstly provided. As shown in FIG. 6A, the metallization structure 50 includes a plurality of individual devices such as transistors, capacitors, and resistors patterned in a substrate 501 (e.g. silicon wafer) by formation operations of front end of line (FEOL). And a series of stacked layers 502 are disposed over the substrate 501 by formation operations of back end of line (BEOL). The stacked layers are fabricated to provide individual devices such as above mentioned transistors, capacitors, and resistors to get interconnected with metal wiring on the substrate. Accordingly, adjacent layers 502 in the metallization structure 50 are linked together through the use of electrical contacts and vias.

Figure 6B:
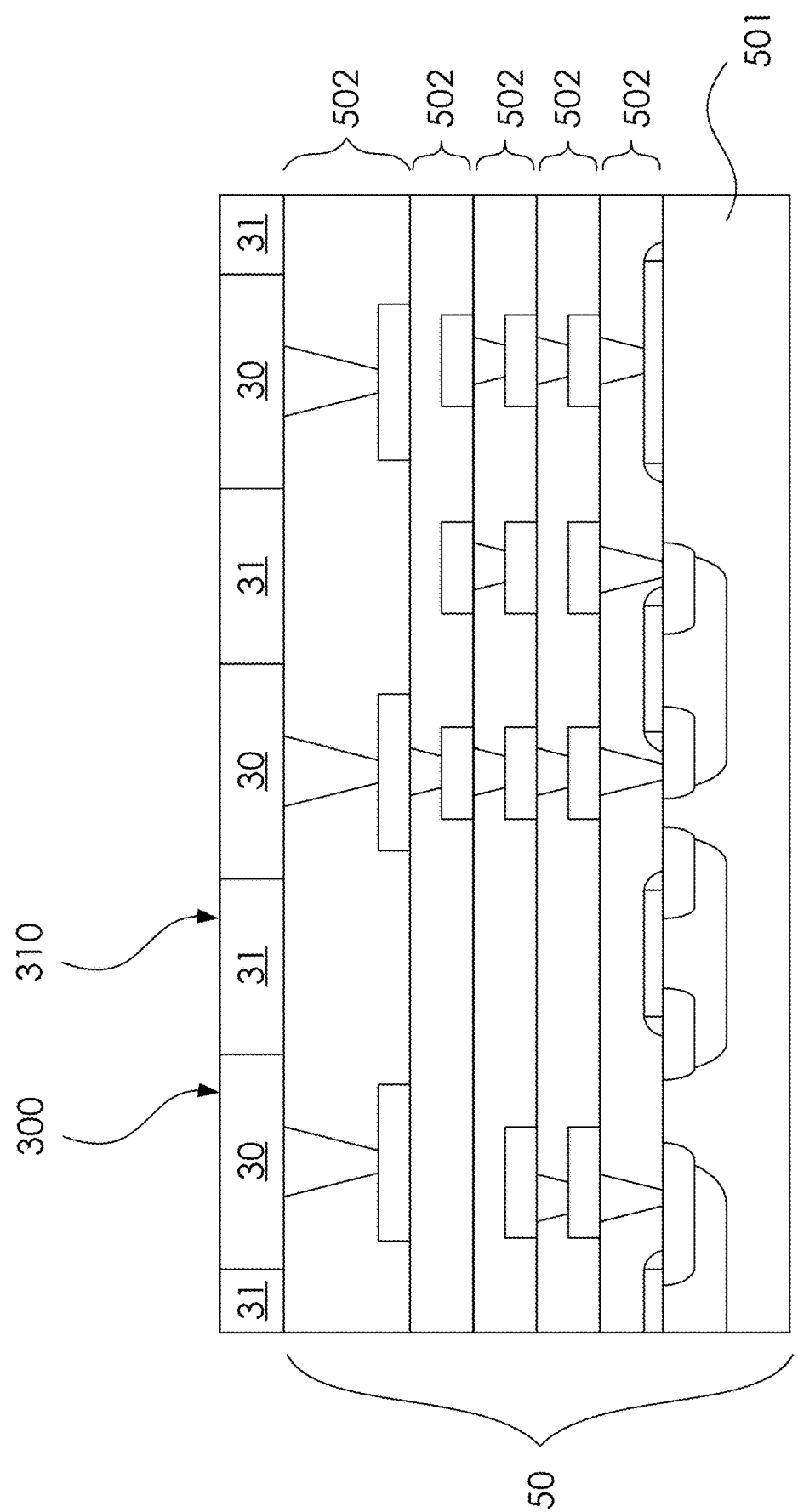

As shown in FIG. 6B, in some embodiments, a plurality of conductive pads 30 are disposed over the metallization structure 50. In some embodiments, the plurality of conductive pads 30 are laterally surrounded by an insulating layer 31, and a top surface 310 of the insulating layer 31 is coplanar with a plurality of top surfaces 300 of the conductive pads 30. In some embodiments, the conductive pads 30 may be made by any suitable conductive material includes but not limited to metal, alloy, metal silicide, or metal nitride. In some embodiments, the conductive pads 30 are made by aluminum copper (AlCu). In some embodiments, the conductive pads 30 is formed by chemical vapor deposition (CVD), low pressure chemical vapor deposition, physical vapor deposition (PVD), atomic layer deposition (ALD), or spin-on.

Before forming the dielectric layer over the conductive pads 30, in some embodiments, the conductive pads 30 made by aluminum copper may be annealed at about 400 Celsius degrees for about 1 minute. The annealing operation is to induce the growth of the hillocks or extrusions form the conductive pads 30 before the depositing operation of the dielectric layer. The hillocks or extrusions may be removed by a followed chemical mechanical planarization (CMP) operation.

Figure 6D:
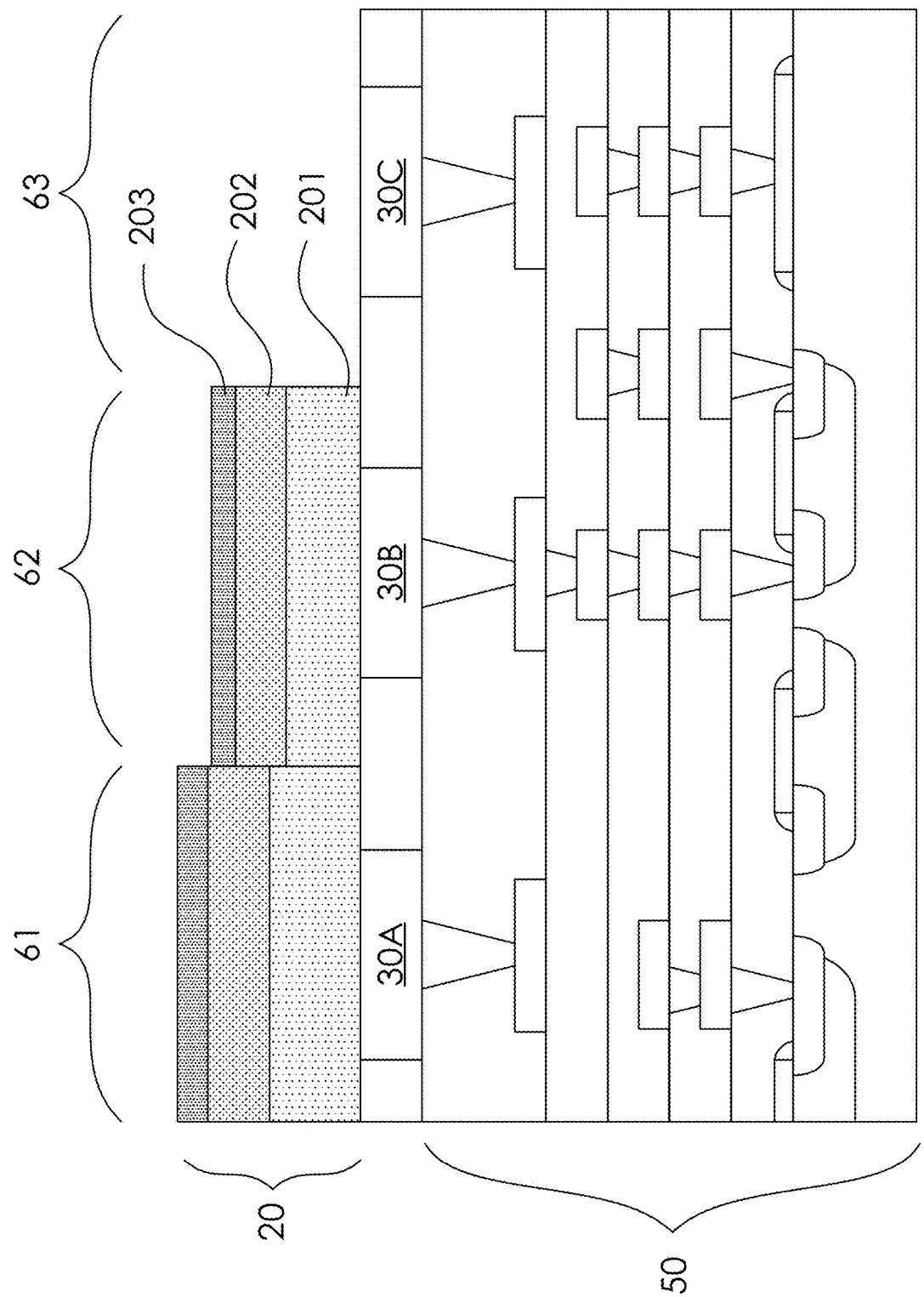
Figure 6E:
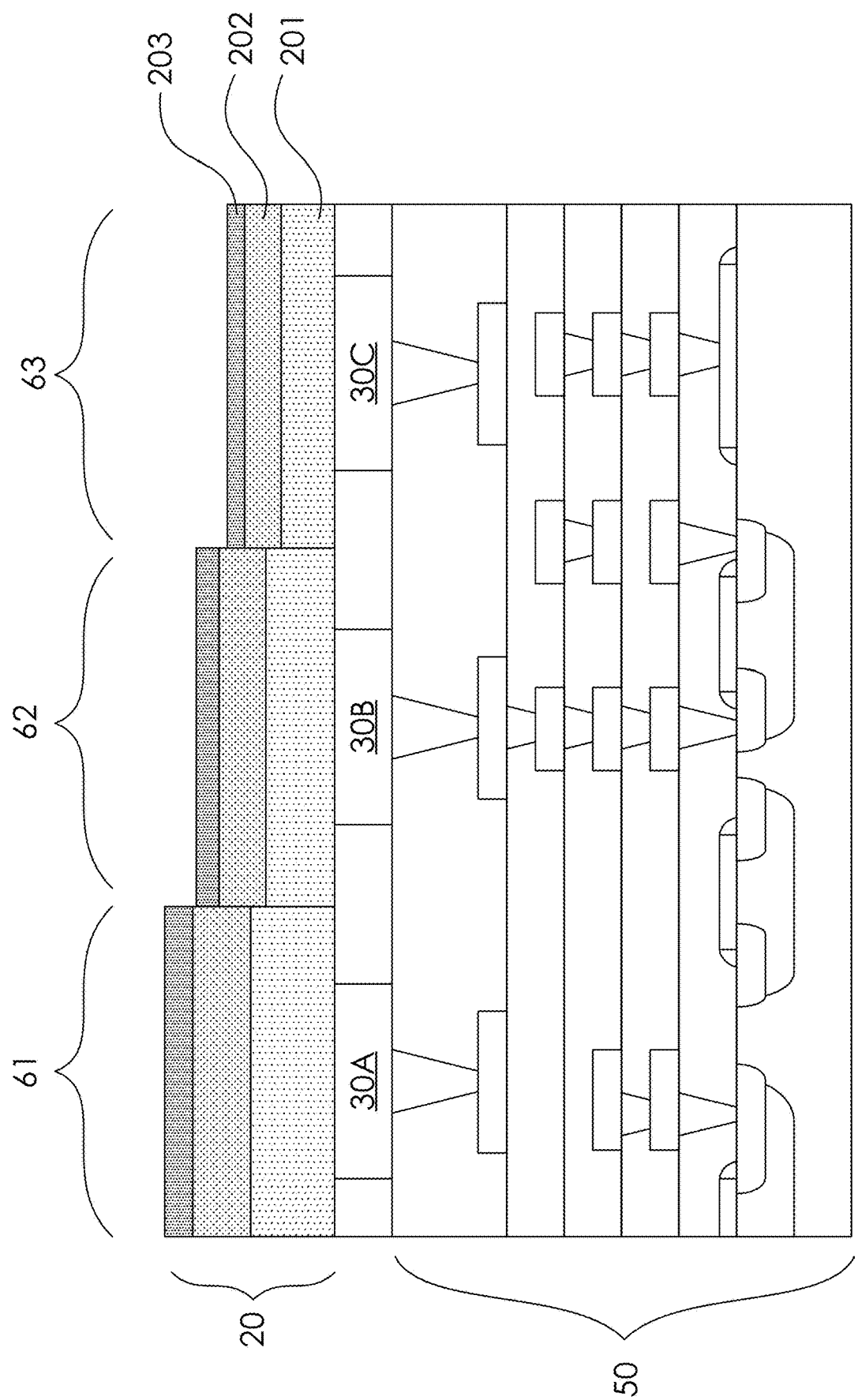
Figure 6E:
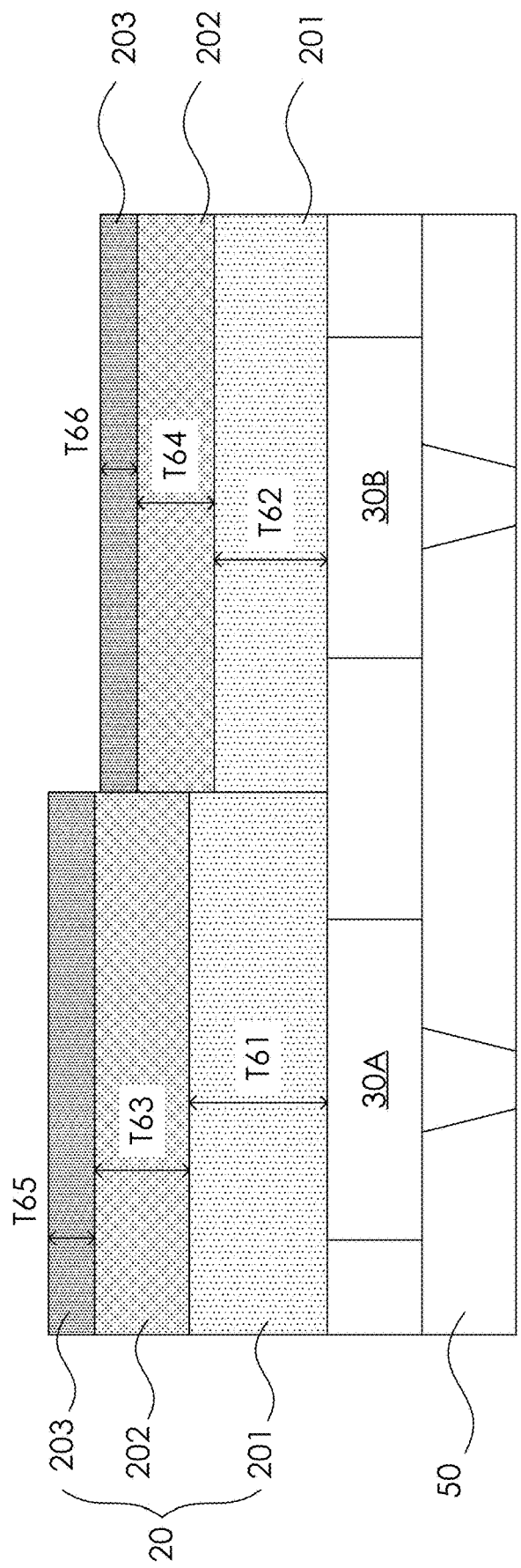

As shown in FIGS. 6C to 6E, after the CMP operation implemented to the conductive pads 30, the dielectric layer 20 is disposed on the conductive pads 30. In some embodiments, the operation temperature in forming the dielectric layer 20 is lower than the annealing operation of the conductive pads 30. In some embodiments, the dielectric layer 20 is formed by plasma enhanced physical vapor deposition (PECVD) at about 250 Celsius degrees. The lower temperature in forming the dielectric layer 20 may maintain a lower surface roughness of the conductive pads 30, that is, the growth of the hillocks or extrusions may be avoided if the temperature in forming the dielectric layer 20 is not as high as that in the previous annealing operation.

In some embodiments, the surface roughness of the conductive pads 30 made by aluminum copper may be decreased from less than about 350 angstroms to less than about 250 angstroms by annealing the conductive pads 30 at about 400 Celsius degrees for about 1 minute. In some embodiments, the surface roughness of the conductive pads 30 made by aluminum copper may be further decreased from less than about 250 angstroms to less than about 100 angstroms by lowering the PECVD temperature in forming the dielectric layer 20 from about 400 Celsius degrees to about 250 Celsius degrees.

In some embodiments, the dielectric layer 20 is formed by a plurality of deposition operations, depending on the counts of the dielectric films and the distribution requirement of colors in a pixel unit. Referring to FIGS. 6C to 6E, in order to form the reflective structure which has different thickness for reflecting different colors of light, in some embodiments, the forming of the dielectric films over the first conductive pad 30A, the second conductive pad 30B, and the third conductive pad 30C may be divided into three different areas 61, 62, and 63 through three masking operations. In some embodiments, the three different areas 61, 62, and 63 may be three pixels configured to reflect different wavelengths, and the three different areas 61, 62, and 63 may be adjacent or not adjacent to each other in a pixel array.

In some embodiments, as shown in FIG. 6C, the area 61 over the first conductive pad 30A is for reflecting red light and the total thickness of the dielectric layer 20 therein is about 1500 angstroms. The thickness of the first dielectric film 201, the second dielectric film 202, and the third dielectric film 203, for instance, may be about 725, 725, and 50 angstroms, respectively. The different dielectric films with ascending refractive indexes may be formed by selecting different precursors or adjusting the ratio of the precursor during a first masking operation.

In some embodiments, as shown in FIG. 6D, the area 62 over the second conductive pad 30B is for reflecting green light and the total thickness of the dielectric layer 20 therein is about 700 angstroms. The thickness of the first dielectric film 201, the second dielectric film 202, and the third dielectric film 203, for instance, may be about 330, 330, and 40 angstroms, respectively. The different dielectric films with ascending refractive indexes may be formed by selecting different precursors or adjusting the ratio of the precursor during a second masking operation.

In some embodiments, as shown in FIG. 6E, the area 63 over the third conductive pad 30C is for reflecting green light and the total thickness of the dielectric layer 20 therein is about 50 angstroms. The thickness of the first dielectric film 201, the second dielectric film 202, and the third dielectric film 203, for instance, may be about 20, 20, and 10 angstroms, respectively. The different dielectric films with ascending refractive indexes may be formed by selecting different precursors or adjusting the ratio of the precursor during a third masking operation.

Consequently, in the areas 61, 62, and 63, the thicknesses of the dielectric layer 20 are about 1500, 700, and 50 angstroms, respectively, and each area also includes the first dielectric film 201, the second dielectric film 202, and the third dielectric film 203 with the refractive index, for instance, 1.47, 1.7, and 1.8, respectively, which is ascending from the bottom film of the dielectric layer 20 to the top film thereof. More precisely, as shown in FIG. 6Ea, which is enlarged from a portion of FIG. 6E, the first conductive pad 30A and the second conductive pad 30B are disposed over the metallization structure 50. The first dielectric film 201 has a first thickness T61 on the first conductive pad 30A and a second thickness T62 on the second conductive pad 30B, and the first thickness is different from the second thickness T62. The second dielectric film 202 has third thickness T63 over the first conductive pad 30A and a fourth thickness T64 over the second conductive pad 30B, and the third thickness T63 is different from the fourth thickness T64. The third dielectric film 203 has a fifth thickness T65 over the first conductive pad 30A and a sixth thickness T66 over the second conductive pad 30B, and the fifth thickness T65 is different from the sixth thickness T66.

Figure 6F:
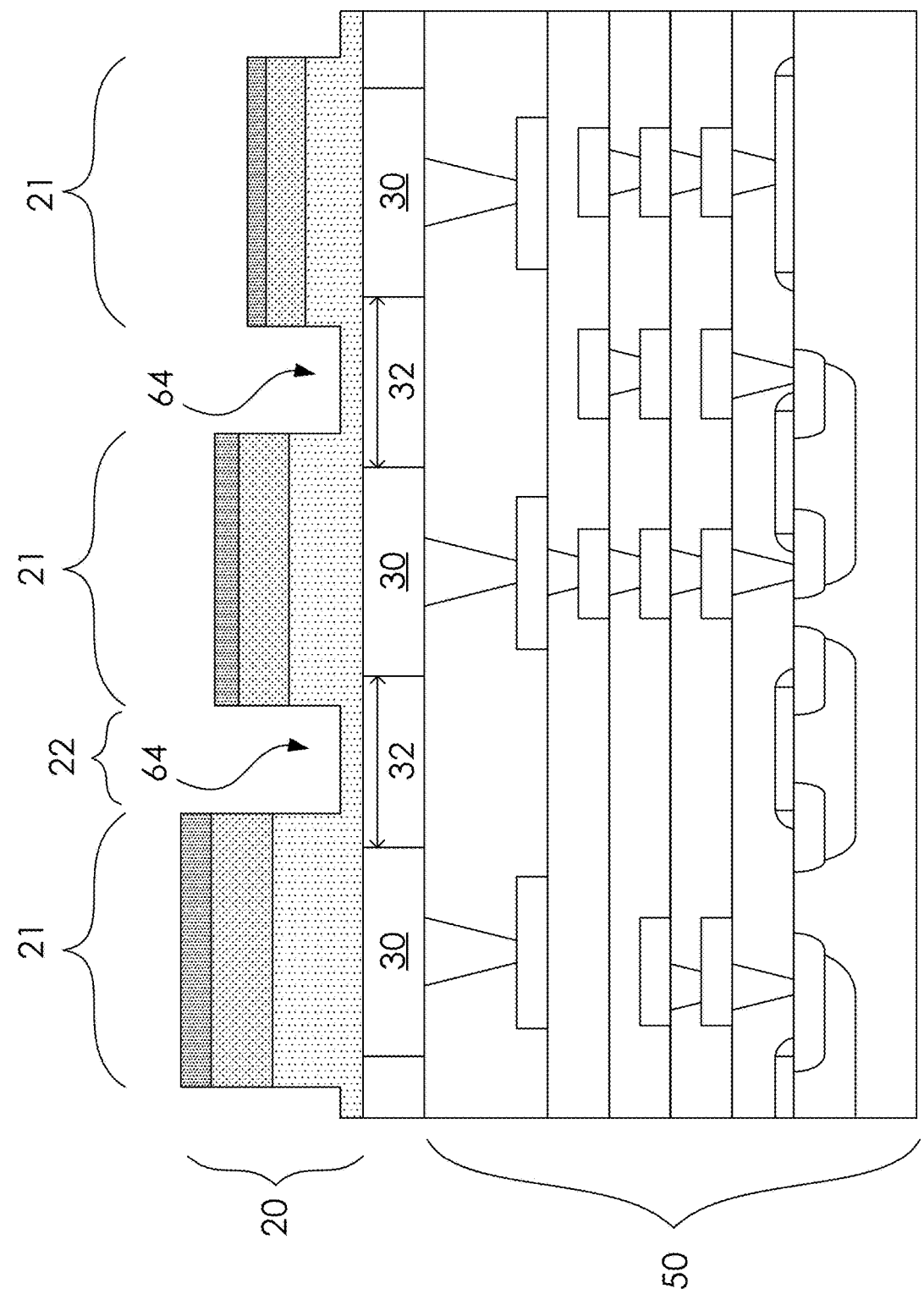
Figure 6F:
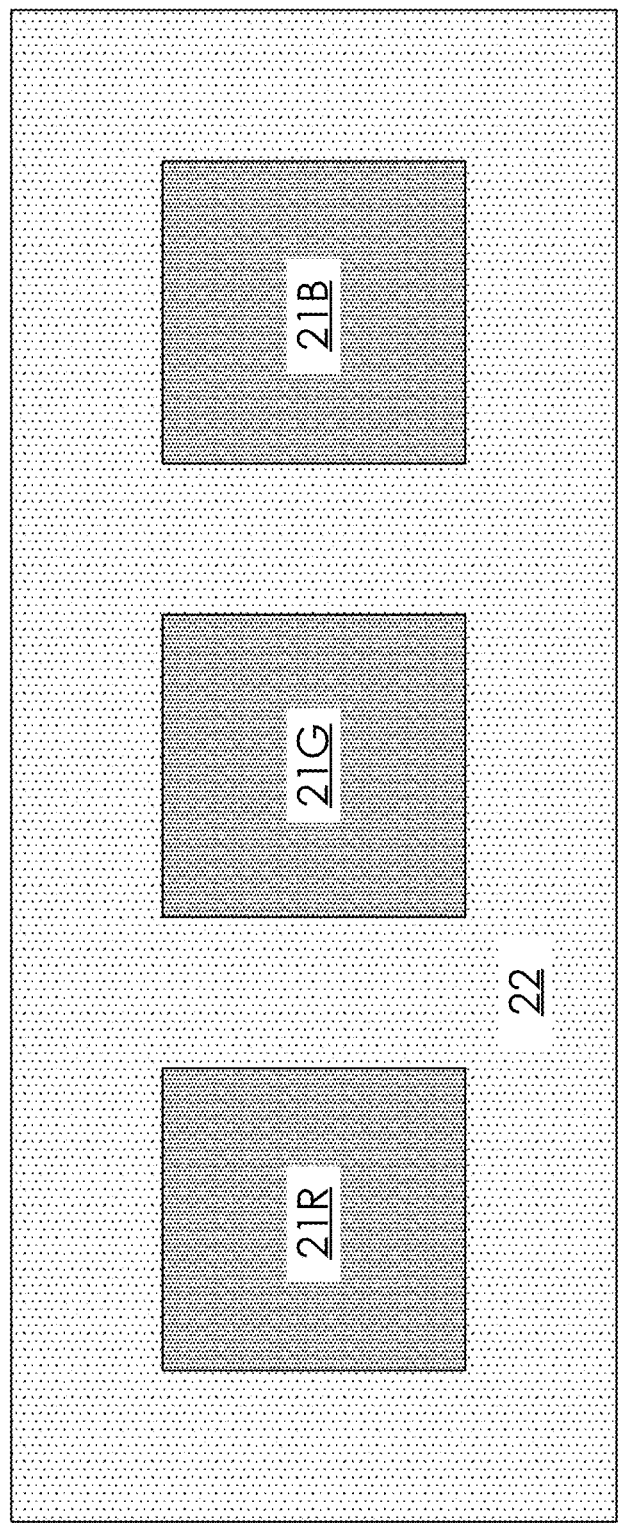

As shown in FIG. 6F, in some embodiments, the dielectric layer 20 includes a plurality of recesses 64 over a plurality of intervals 32 between each two adjacent conductive pads 30. In some embodiments, the recesses 64 may be formed by etching operations. The recesses 64 may isolate the areas 61, 62, and 63 mentioned in previous operations into the raised portions 21 and the edge portions 22 as previously mentioned in FIG. 5. In some embodiments, the thickness of the dielectric layer 20 at the bottom of the recesses 64 is smaller than about 50 angstroms and thus no visible light may be substantially reflected.

In some embodiments, the method for forming the dielectric films is not limited to PECVD, for example, the first dielectric film 201 and the second dielectric film 202 may be formed by CVD or PECVD, whereas the third dielectric film 203 is formed by ALD. Particularly, in some embodiments, the material of the first dielectric film 201 and the second dielectric film 202 are silicon oxide instead of aluminum oxide used in the third dielectric film 203. Accordingly, in some embodiments, a density of the first dielectric firm 201 or the second dielectric film 202 is smaller than a density of the third dielectric film 203.

As shown in FIG. 6Fa, according to a top view of the semiconductor structure formed by the operations as shown in FIGS. 6A to 6F, the raised portions 21R, 21G, and 21B of the dielectric layer may reflect red light, green light, and blue light, respectively, and the raised portions 21R, 21G, and 21B may be distinguished by the edge portion 22 clearly.

Figure 6G:
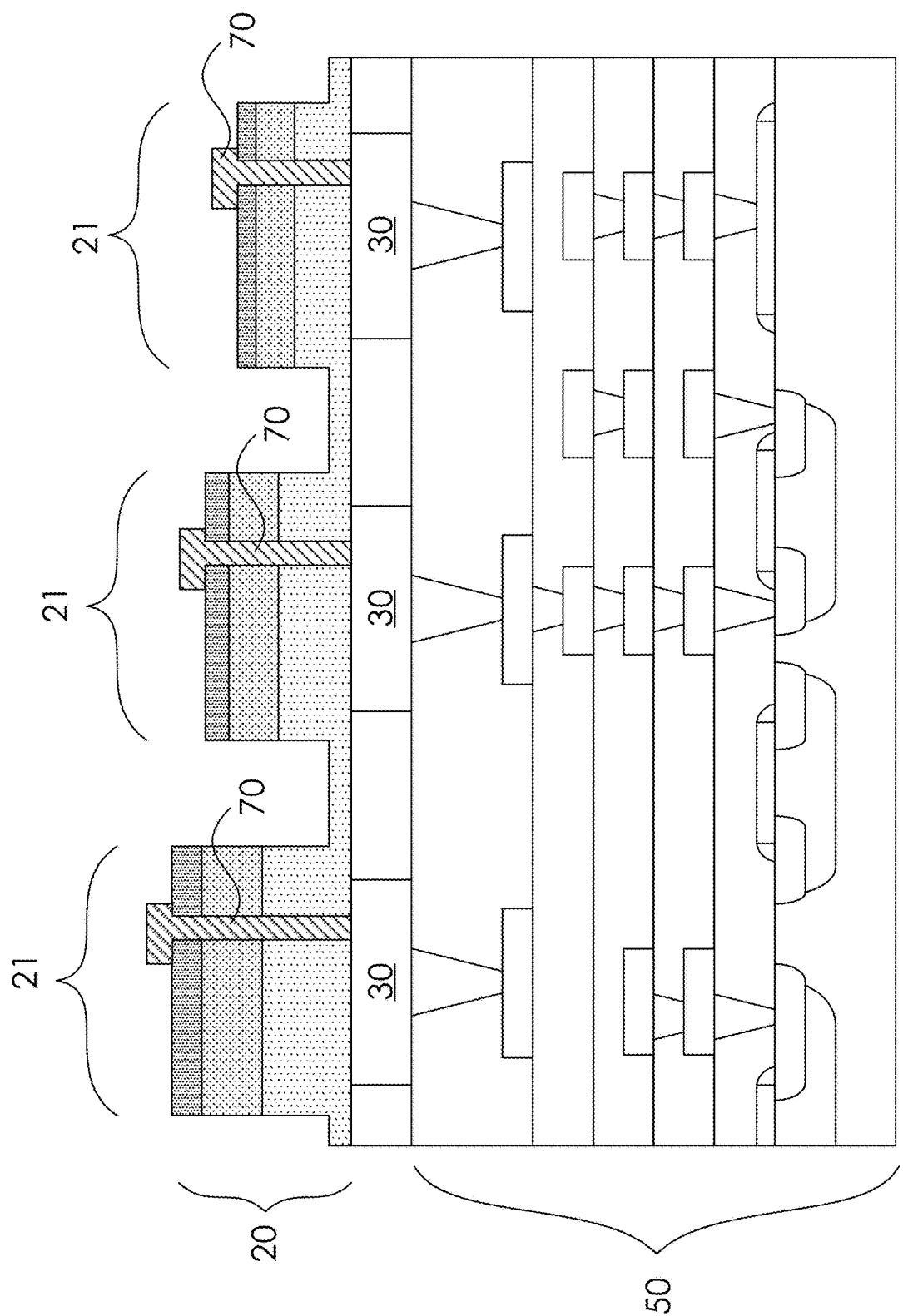
Figure 6H:
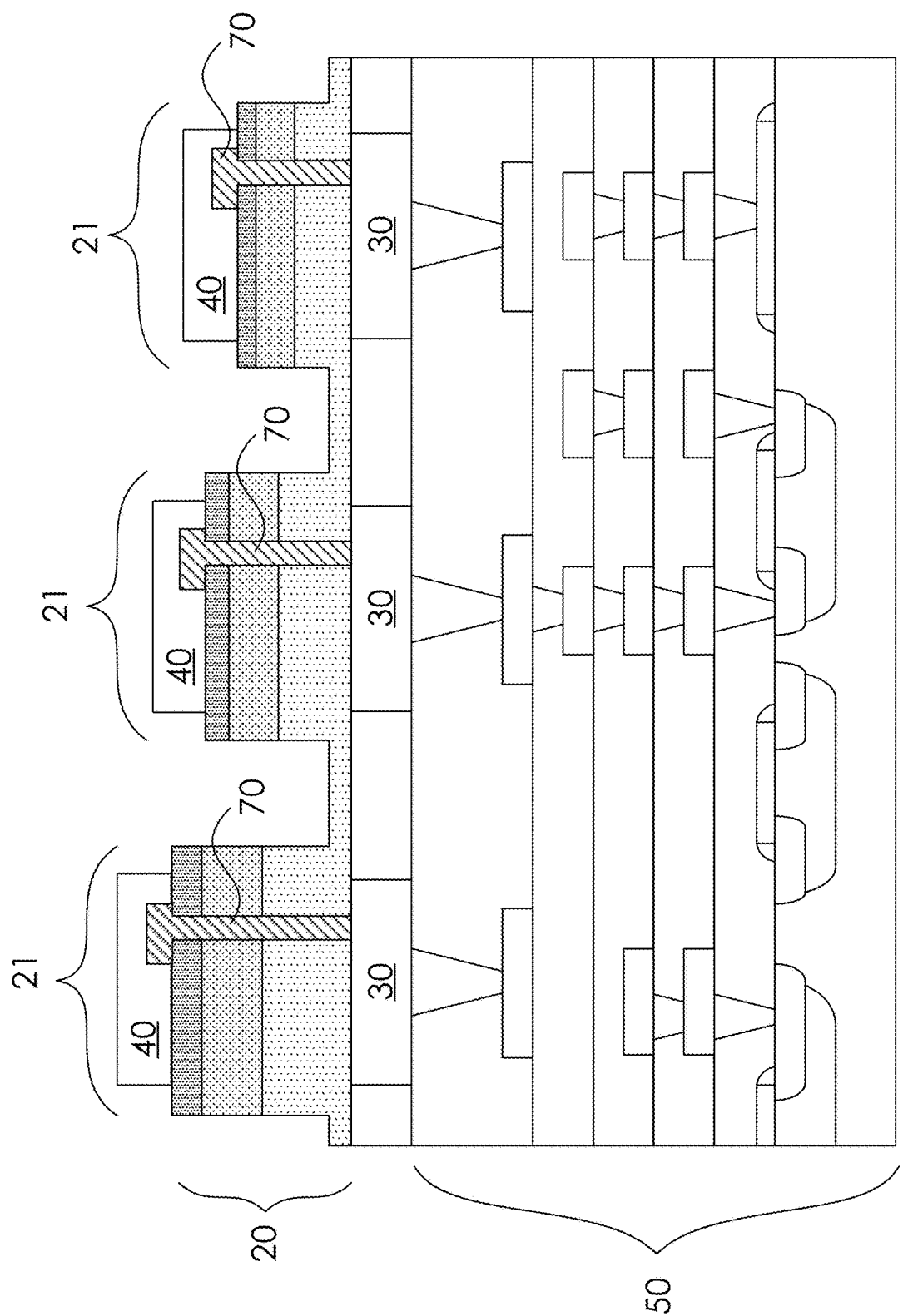

As shown in FIG. 6G, in some embodiments, a plurality of electrical connections 70 may be formed through each of the raised portions 21 of the dielectric layer 20 in a plurality of contact forming operations. And as shown in FIG. 6H, the conductive oxide layer 40 is formed over the dielectric layer 20. More precisely, each of the raised portions 21 may be covered by the conductive oxide layer 40, and the electrical connections 70 may connect the conductive oxide layer 40 and the conductive pads 30. In some embodiments, the conductive oxide layer 40 is an indium tin oxide (ITO) layer.

Figure 6I:
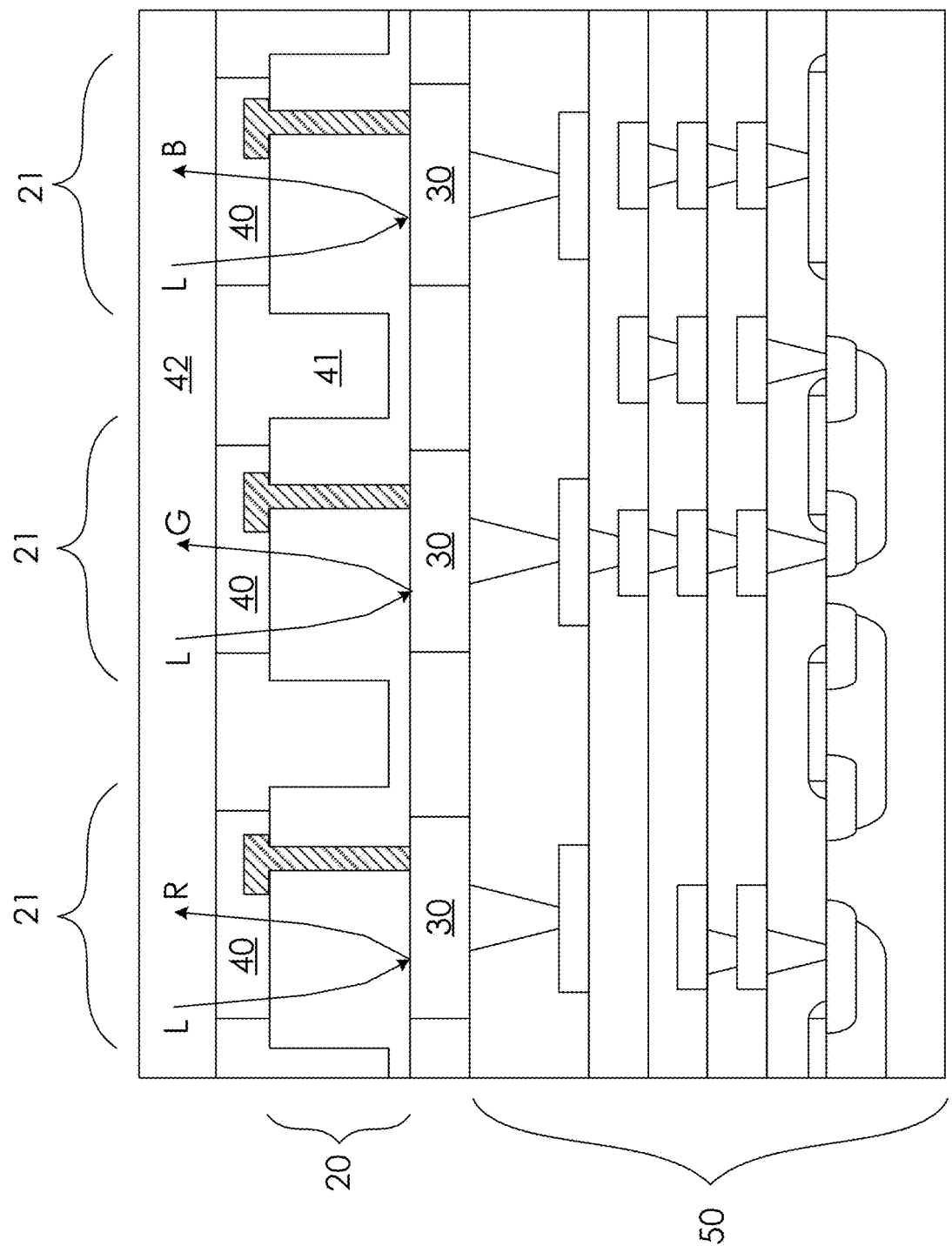

The reflective structure described herein may be integrated with light emitting devices such as a micro-OLED 42. The dielectric layer 20 is surrounded by a subsequently-deposited insulating layer 41 to fill the gap between adjacent dielectric layers 20. The micro-OLED 42 can be disposed over the insulating layer 41 and the reflective structure. In some embodiments, the conductive oxide layer 40 is in contact with an electrode of the micro-OLED 42. In some embodiments, as shown in FIG. 6I, the lights L from the micro-OLED 42 enter the dielectric layer 20 of the reflective structure. More precisely, the lights L may penetrate the dielectric layers 20 and be reflected by the conductive pads 30. As aforementioned, the thickness of the dielectric layer 20 is related to the wavelength that the dielectric layers 20 reflected. In some embodiments, the Red light R, Green light G, and Blue light B may be reflected by the dielectric layers 20 with different thicknesses. In some embodiments, the source of the light L may be light emitting layers disposed higher than the reflective structure. For the purpose of clear demonstration, differences among the thicknesses of each of the dielectric layers 20 are not drawn according to scale.

Thickness difference between each of the dielectric layers 20 can be microscopically minute and hence the conductive oxide layers 40 on each of the discrete dielectric layers 20 can be in contact with the electrode of the micro-OLED 42.

Figure 7A:
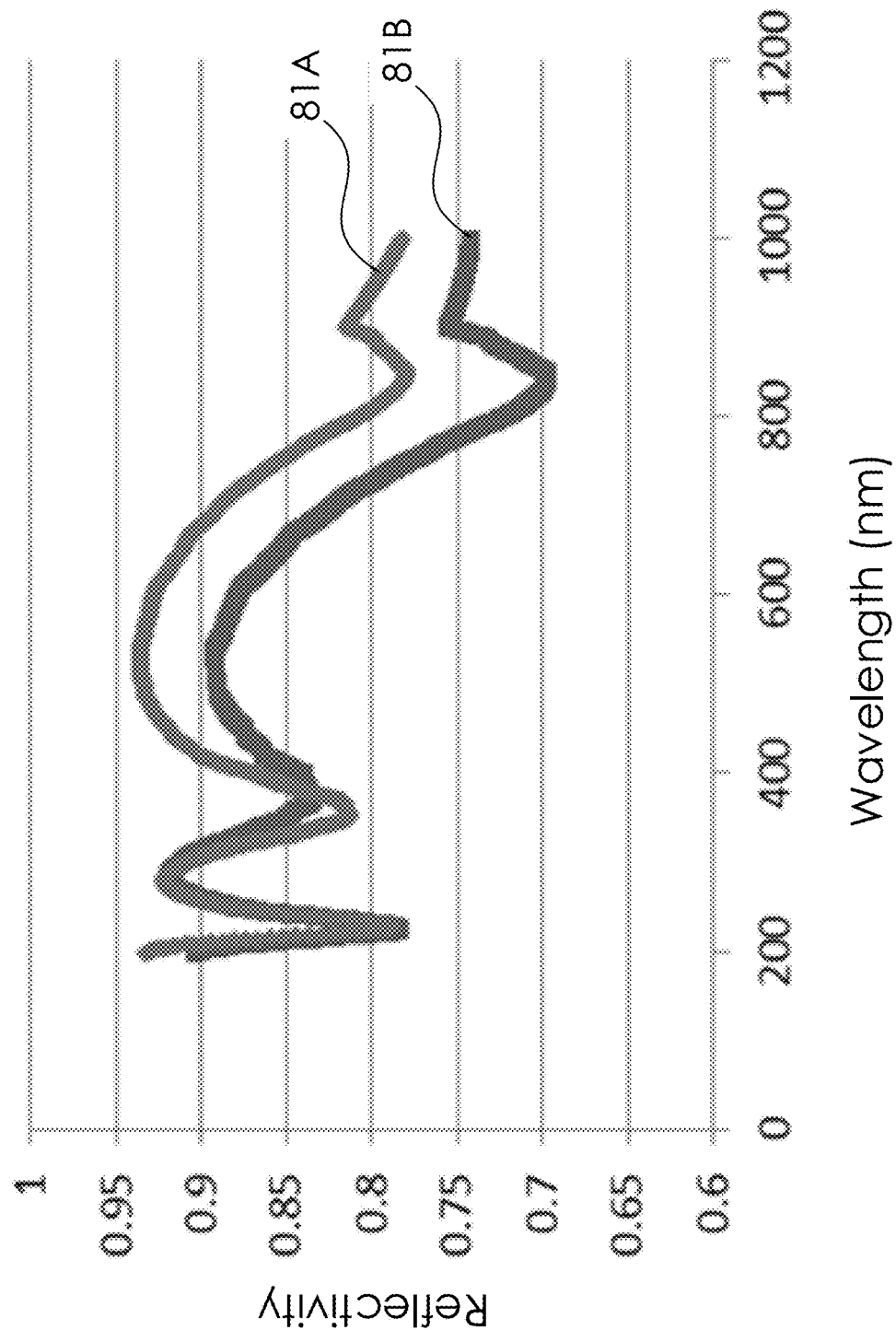
FIG. 7A illustrates a scatter gram regarding the total reflectivity of the reflective structure according to some embodiments of the present disclosure.

Referring to FIG. 7A, FIG. 7A shows a relation between a total reflectivity of the dielectric layer with respect to different incident wavelengths. The total reflectivity of a reflective structure is compared under two conditions: one by forming three dielectric films with ascending refractive indexes in an order of from conductive pad 30 to the conductive oxide layer 40, another by forming three dielectric films with descending refractive indexes in an order of from conductive pad 30 to the conductive oxide layer 40. The line 81A refers to the total reflectivity that the dielectric films with refractive indexes of about 1.47, 1.7, and 1.8 stacked from the bottom to the top, whereas with the refractive indexes of about 1.8, 1.7, and 1.47 stacked from the bottom to the top referred as the line 81B. In the wavelength of visible light (about 380 nm to 750 nm), the total reflectivity of the reflective structure with ascending refractive indexes is higher than that with descending refractive indexes.

Figure 7B:
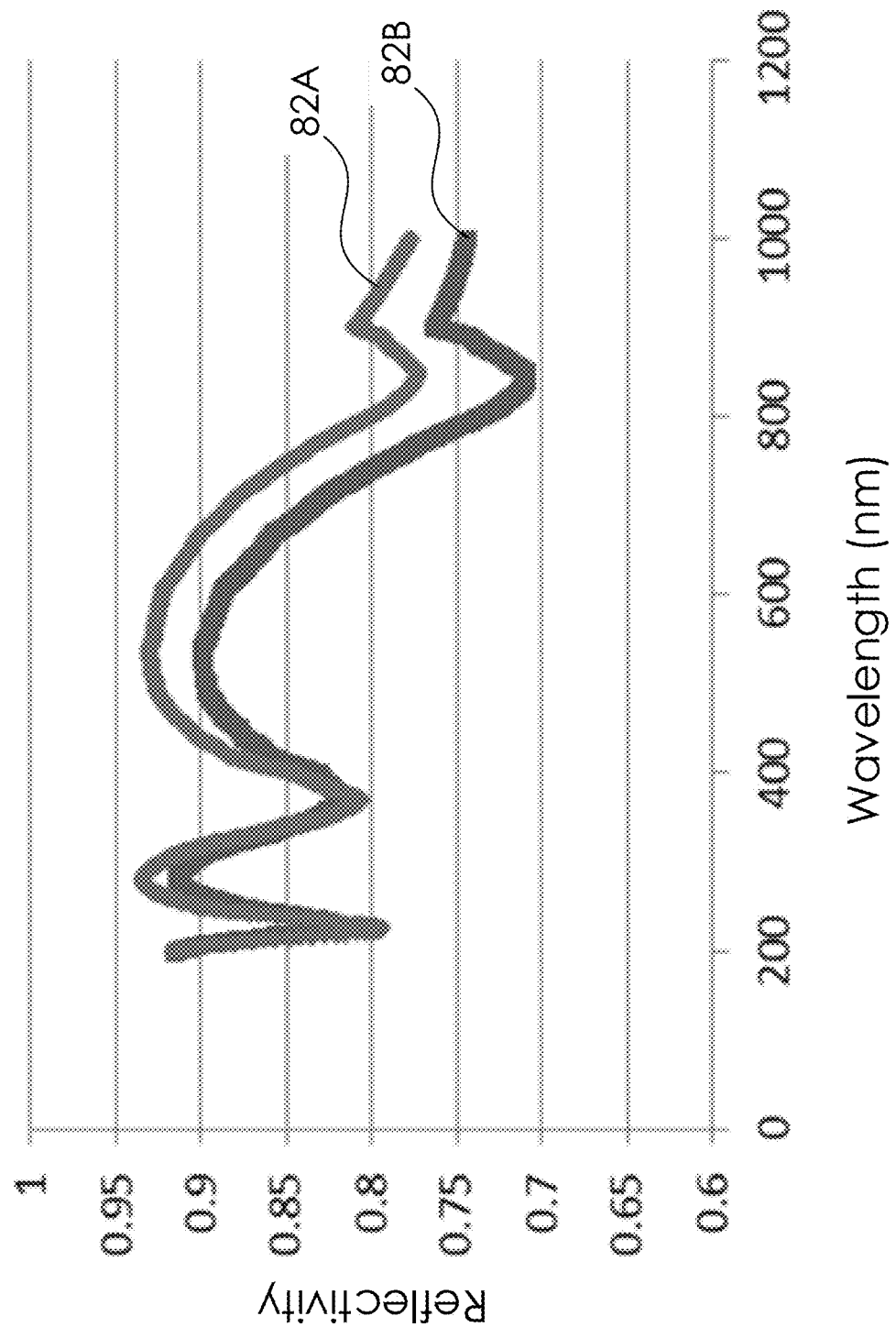
FIG. 7B illustrates a scatter gram regarding the total reflectivity of the reflective structure according to some embodiments of the present disclosure.

Referring to FIG. 7B, FIG. 7B shows a relation between a total reflectivity of the dielectric layer with respect to different incident wavelengths. The total reflectivity of a reflective structure is compared under two conditions: one by forming four dielectric films with ascending refractive indexes in an order of from conductive pad 30 to the conductive oxide layer 40, another by forming four dielectric films with descending refractive indexes in an order of from conductive pad 30 to the conductive oxide layer 40. The line 82A refers to the total reflectivity that the dielectric films with refractive indexes of about 1.5, 1.6, 1.7, and 1.8 stacked from the bottom to the top, whereas with the refractive indexes of about 1.8, 1.7, 1.6 and 1.5 stacked from the bottom to the top referred as the line 82B. In the wavelength of visible light, the total reflectivity of the reflective structure with more than three ascending refractive indexes is also higher than that with descending refractive indexes.

Figure 7C:
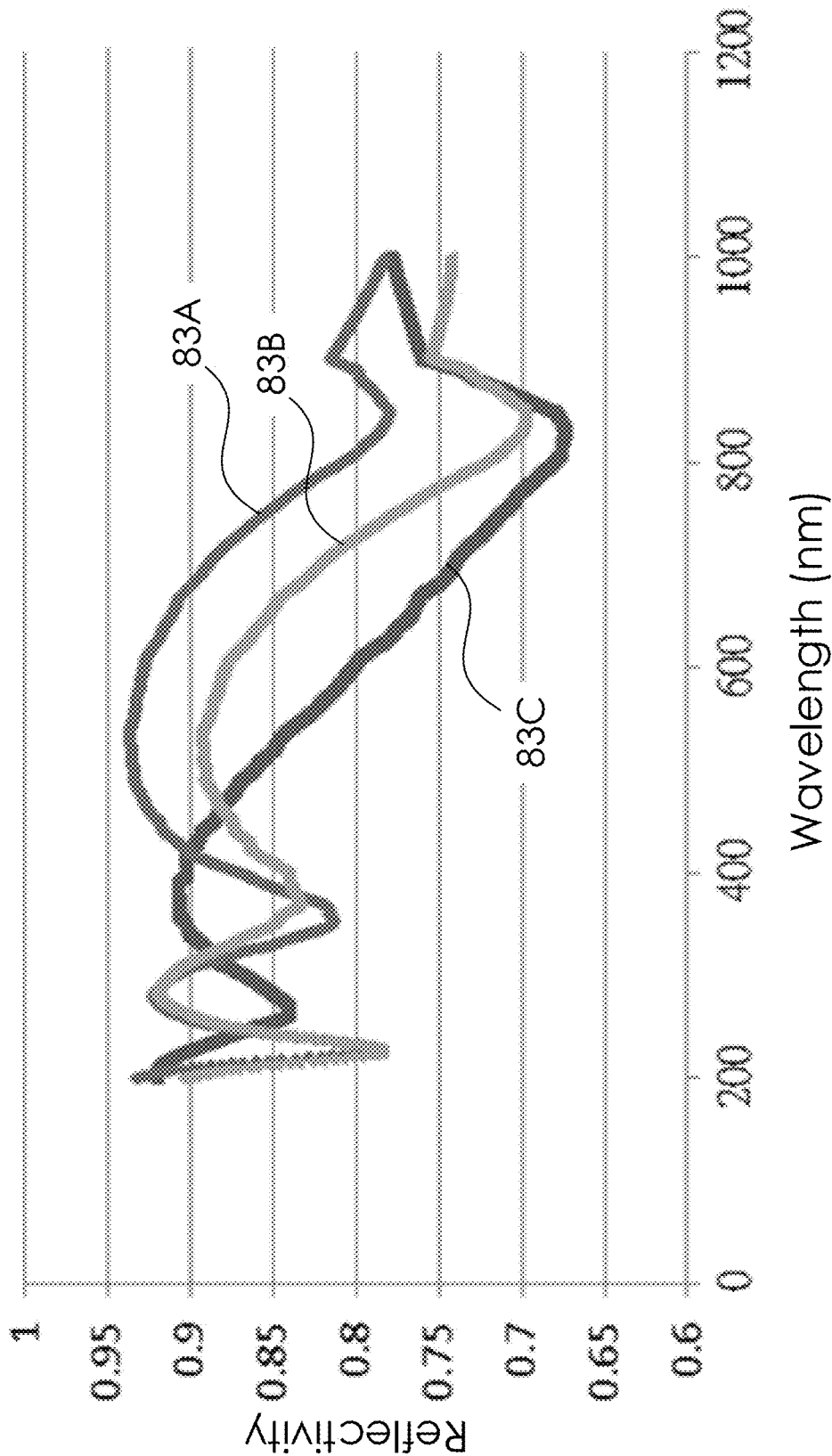
FIG. 7C illustrates a scatter gram regarding the total reflectivity of the reflective structure according to some embodiments of the present disclosure.

Referring to FIG. 7C, FIG. 7C shows a relation between a total reflectivity of the dielectric layer with respect to different incident wavelengths. The total reflectivity of a reflective structure is compared under three conditions: one by forming three dielectric films with ascending refractive indexes in an order of from conductive pad 30 to the conductive oxide layer 40, another by forming three dielectric films with descending refractive indexes in an order of from conductive pad 30 to the conductive oxide layer 40, yet another by forming three dielectric films with random refractive indexes arrangement other than ascending or descending order. The line 83A refers to the reflectivity that the dielectric films with refractive indexes of about 1.47, 1.7, and 1.8 stacked from the bottom to the top, whereas with the refractive indexes of about 1.8, 1.7, and 1.47 stacked from the bottom to the top referred as the line 83B, and whereas with the refractive indexes of about 1.7, 1.8, and 1.47 stacked from the bottom to the top referred as the line 83C. In the wavelength of visible light, the total reflectivity of the reflective structure with ascending refractive indexes is not only higher than that with descending refractive indexes, but also higher than that with random refractive indexes.

In the present disclosure, the reflective structure includes a dielectric layer on a metal base with at least three dielectric films stacked with refractive indexes arranged in an ascending order. The total reflectivity of the reflective structure may thus be increased, and the requirement of uniformity of the dielectric layer may be alleviated.

In one exemplary aspect, a reflective structure is provided. The reflective structure includes: a metal base and a dielectric layer. The metal base has a first surface. The dielectric layer is disposed on the first surface, and has a first dielectric film, a second dielectric film, and a third dielectric film. The first dielectric film is disposed on the first surface. The second dielectric film is disposed on the first dielectric film. The third dielectric film is disposed on the second dielectric film. A refractive index of the first dielectric film is smaller than a refractive index of the second dielectric film, and the refractive index of the second dielectric film is smaller than a refractive index of the third dielectric film.

In another exemplary aspect, a reflective structure is provided. The reflective structure includes: an interconnect structure, a first metal base, a second metal base, a first dielectric film, a second dielectric film, and a third dielectric film. The first metal base and the second metal base are over the interconnect structure. The first dielectric film has a first thickness on the first metal base and a second thickness on the second metal base. The first thickness is different from the second thickness. The second dielectric film is on the first dielectric film. The second dielectric film has a third thickness over the first metal base and a fourth thickness over the second metal base. The third thickness is different from the fourth thickness. The third dielectric film is on the second dielectric film. The third dielectric film has a fifth thickness over the first metal base and a sixth thickness over the second metal base. The fifth thickness is different from the sixth thickness. The refractive index of the first dielectric film is smaller than a refractive index of the second dielectric film, and the refractive index of the second dielectric film is smaller than a refractive index of the third dielectric film.

In yet another exemplary aspect, a semiconductor structure is provided. The semiconductor structure includes metallization structure, a plurality of conductive pads, and a dielectric layer. The plurality of conductive pads is over the metallization structure. The dielectric layer is on the metallization structure and covers the conductive pad. The dielectric layer includes a first dielectric film, a second dielectric film, and a third dielectric film. The first dielectric film is on the conductive pad. The second dielectric film is on the first dielectric film. The third dielectric film is on the second dielectric film. The a refractive index of the first dielectric film is smaller than a refractive index of the second dielectric film, and the refractive index of the second dielectric film is smaller than a refractive index of the third dielectric film.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A reflective structure, comprising:
   a metal base having a first surface;
   a dielectric layer on the first surface, the dielectric layer comprising:
      a first dielectric film on the first surface;

a second dielectric film on the first dielectric film; and
a third dielectric film on the second dielectric film;
an electrical connection penetrating the dielectric layer and in contact with a conductive pad; and
a conductive oxide layer over the dielectric layer and in contact with the electrical connection;
wherein a refractive index of the first dielectric film is smaller than a refractive index of the second dielectric film, and the refractive index of the second dielectric film is smaller than a refractive index of the third dielectric film.

2. The reflective structure of claim 1, wherein a material of the first dielectric film is identical with a material of the second dielectric film.

3. The reflective structure of claim 1, wherein a material of the first dielectric film is different from a material of the third dielectric film.

4. The reflective structure of claim 1, wherein an area of the first dielectric film is greater than an area of the metal base.

5. The reflective structure of claim 1, wherein the metal base is laterally surrounded by an insulating layer.

6. The reflective structure of claim 5, wherein a portion of the insulating layer is covered by the first dielectric film.

7. The reflective structure of claim 5, wherein a top surface of the insulating layer is coplanar with a top surface of the metal base.

8. A reflective structure, comprising:
a first metal base and a second metal base over an interconnect structure;
a first dielectric film having a first thickness on the first metal base and a second thickness on the second metal base, the first thickness is greater than the second thickness;
a second dielectric film on the first dielectric film, having a third thickness over the first metal base and a fourth thickness over the second metal base, the third thickness is greater than the fourth thickness; and
a third dielectric film on the second dielectric film, having a fifth thickness over the first metal base and a sixth thickness over the second metal base, the fifth thickness is greater than the sixth thickness;
wherein a refractive index of the first dielectric film is smaller than a refractive index of the second dielectric film, and the refractive index of the second dielectric film is smaller than a refractive index of the third dielectric film.

9. The reflective structure of claim 8, wherein the second dielectric film further comprises a plurality of sublayers between the first dielectric film and the third dielectric film.

10. The reflective structure of claim 8, wherein a material of the first dielectric film is silicon oxide and a material of the third dielectric film is aluminum oxide.

11. The reflective structure of claim 9, wherein the plurality of refractive indexes of the plurality of sublayers are in a range of from about 1.47 to about 1.8.

12. The reflective structure of claim 9, wherein a refractive index of a bottom of the sublayers is smaller than a refractive index of a top of the sublayers.

13. The reflective structure of claim 8, wherein a density of the second dielectric film is smaller than a density of the third dielectric film.

14. The reflective structure of claim 8, wherein a surface roughness of the first metal base is less than 100 angstroms.

15. The reflective structure of claim 8, further comprising a recess isolating a stack of the first dielectric film and the second dielectric film into two raised portions.

16. The reflective structure of claim 15, wherein the first dielectric film at a bottom of the recess is smaller than about 50 angstroms and free from covered by the second dielectric film.

17. A semiconductor structure, comprising:
a metallization structure;
a plurality of conductive pads over the metallization structure;
a dielectric layer on the metallization structure and covers the conductive pads, the dielectric layer comprising:
a first dielectric film on the conductive pads;
a second dielectric film on the first dielectric film; and
a third dielectric film on the second dielectric film;
a conductive oxide layer over the dielectric layer; and
an electrical connection connecting the conductive oxide layer and the conductive pads;
wherein a refractive index of the first dielectric film is smaller than a refractive index of the second dielectric film, and the refractive index of the second dielectric film is smaller than a refractive index of the third dielectric film.

18. The semiconductor structure of claim 17, wherein the dielectric layer further comprises a recess over an interval between two adjacent conductive pads.

19. The semiconductor structure of claim 17, wherein the dielectric layer further comprises a plurality of raised portions, and each of the raised portions having a thickness different from a thickness of an adjacent raised portion.

20. The semiconductor structure of claim 17, wherein the second dielectric film comprises a plurality of sublayers, a refractive index of a bottom of the sublayers is smaller than a refractive index of a top of the sublayers.

* * * * *